United States Patent
Leong et al.

(10) Patent No.: US 9,444,510 B2
(45) Date of Patent: Sep. 13, 2016

(54) METHOD AND APPARATUS FOR INCORPORATING PASSIVE DEVICES IN AN INTEGRATED PASSIVE DEVICE SEPARATE FROM A DIE

(71) Applicant: Marvell World Trade LTD., St. Michael (BB)

(72) Inventors: Poh Boon Leong, Cupertino, CA (US); Albert Wu, Palo Alto, CA (US); Long-Ching Wang, Cupertino, CA (US); Sehat Sutardja, Los Altos Hills, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/627,354

(22) Filed: Feb. 20, 2015

(65) Prior Publication Data

US 2015/0244410 A1    Aug. 27, 2015

Related U.S. Application Data

(60) Provisional application No. 61/943,226, filed on Feb. 21, 2014.

(51) Int. Cl.
*H04B 1/38* (2015.01)
*H04B 1/40* (2015.01)
(Continued)

(52) U.S. Cl.
CPC ............ *H04B 1/40* (2013.01); *H01L 21/76898* (2013.01); *H01L 23/481* (2013.01); *H01L 23/49503* (2013.01); *H01L 23/49575* (2013.01); *H01L 23/66* (2013.01); *H01L 24/17* (2013.01); *H01L 24/49* (2013.01); *H01L 24/85* (2013.01); *H01L 25/16* (2013.01); *H01L 25/162* (2013.01); *H01L 25/50* (2013.01); *H04B 1/00* (2013.01);
(Continued)

(58) Field of Classification Search
CPC ........... H04B 1/40; H04B 1/406; H04B 1/38
USPC .......................................................... 455/73
See application file for complete search history.

(56) References Cited

U.S. PATENT DOCUMENTS 7,356,213 B1 * 4/2008 Cunningham .......... H01L 23/48
                                                    257/E23.01
7,817,880 B1 * 10/2010 Drost ....................... G02B 6/43
                                                           385/129

(Continued)

OTHER PUBLICATIONS

Invitation to Pay Additional Fees for PCT Application No. PCT/US2015/016889 dated Jun. 1, 2015; 7 pages.

(Continued)

*Primary Examiner* — April G Gonzales

(57) ABSTRACT

A circuit including a first die, an integrated passive device and a second layer. The first die includes a first substrate and active devices. The integrated passive device includes a first layer, a second substrate and passive devices. The second substrate includes vias. The passive devices are implemented at least on the first layer or the second substrate. A resistivity per unit area of the second substrate is greater than a resistivity per unit area of the first substrate. The second layer is disposed between the first die and the integrated passive device. The second layer includes pillars. Each of the pillars connects a corresponding one of the active devices to (i) one of the vias, or (ii) one of the passive devices. The first die, the integrated passive device and the second layer are disposed relative to each other to form a stack.

20 Claims, 8 Drawing Sheets

(51) Int. Cl.

| | |
|---|---|
| H01L 21/768 | (2006.01) |
| H01L 23/48 | (2006.01) |
| H01L 23/495 | (2006.01) |
| H01L 23/66 | (2006.01) |
| H01L 23/00 | (2006.01) |
| H01L 25/16 | (2006.01) |
| H01L 25/00 | (2006.01) |
| H04B 1/00 | (2006.01) |
| H04B 15/04 | (2006.01) |
| H01L 23/64 | (2006.01) |
| H01L 49/02 | (2006.01) |

(52) U.S. Cl.
CPC .............. *H04B 15/04* (2013.01); *H01L 23/645* (2013.01); *H01L 28/10* (2013.01); *H01L 2223/6644* (2013.01); *H01L 2223/6672* (2013.01); *H01L 2223/6677* (2013.01); *H01L 2224/16145* (2013.01); *H01L 2224/16225* (2013.01); *H01L 2224/16265* (2013.01); *H01L 2224/32145* (2013.01); *H01L 2224/32265* (2013.01); *H01L 2224/48247* (2013.01); *H01L 2224/48465* (2013.01); *H01L 2224/49* (2013.01); *H01L 2224/73204* (2013.01); *H01L 2224/85* (2013.01); *H01L 2924/00014* (2013.01); *H01L 2924/102* (2013.01); *H01L 2924/10253* (2013.01); *H01L 2924/1304* (2013.01); *H01L 2924/13091* (2013.01); *H01L 2924/1421* (2013.01); *H01L 2924/19011* (2013.01); *H01L 2924/19103* (2013.01)

(56) References Cited

U.S. PATENT DOCUMENTS

| | | | | |
|---|---|---|---|---|
| 7,840,136 | B1 * | 11/2010 | Cunningham | H04Q 3/66 385/16 |
| 2010/0127345 | A1 | 5/2010 | Sanders et al. | |
| 2010/0225436 | A1 | 9/2010 | Papavasiliou et al. | |
| 2011/0042798 | A1 * | 2/2011 | Pagaila | H01L 21/568 257/692 |
| 2011/0163414 | A1 * | 7/2011 | Lin | H01L 23/3128 257/531 |
| 2011/0291786 | A1 | 12/2011 | Li et al. | |
| 2012/0049334 | A1 * | 3/2012 | Pagaila | H01L 21/568 257/666 |
| 2012/0181673 | A1 * | 7/2012 | Pagaila | H01L 21/568 257/659 |
| 2013/0069239 | A1 * | 3/2013 | Kim | H01L 23/49827 257/774 |
| 2013/0201316 | A1 * | 8/2013 | Binder | H04L 67/12 348/77 |
| 2013/0201406 | A1 * | 8/2013 | Ling | H04H 40/90 348/726 |
| 2013/0229926 | A1 | 9/2013 | Lu et al. | |
| 2014/0070422 | A1 | 3/2014 | Hsiao et al. | |

OTHER PUBLICATIONS

Invitation to Pay Additional Fees for PCT Application No. PCT/US2015/016823 dated Jun. 1, 2015; 6 pages.

IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.

IEEE Std 802.20/2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.

802.16/2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.

"Specification of the Bluetooth System" Master Table of Contents & Compliance Requirements—Covered Core Package version: 4.0; Jun. 30, 2010; 2302 pages.

IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

802.20 V14; Draft 802.20 Permanent Document; System Requirements for IEEE 802.20 Mobile Broadband Wireless Access Systems—Version 14; Jul. 16, 2004; 24 pages.

IEEE Std. 802.3-2002 (Revision of IEEE Std. 802.3, 2000 Edition); IEEE Standard for Information technology—Telecommunications and information exchange between systems—Local and metropolitan area networks—Specific requirements; Part 3: Carrier sense multiple access with collision detection (CSMA/CD) access method and physical layer specifications; IEEE Computer Society; Sponsored by the LAN/MAN Standards Committee; Mar. 8, 2002; 1538 pages.

IEEE P802.11 Wireless LANs; Proposed Specification Framework for TGah; Minyoung Park; Mar. 12, 2012; 13 pages.

IEEE P802.11ad/D5.0, Sep. 2011; Part 11: Wireless LAN Medium Access Control (MAC) and Physical Layer (PHY) Specification.

IEEE P802.11ac/D2.0, Jan. 2012; Part 11: Wireless LAN Medium Access Control (MAC) and Physical Layer (PHY) Specification.

Part 11: Wireless LAN Medium Access Control (MAC) and Physical Layer (PHY) Specification.

* cited by examiner

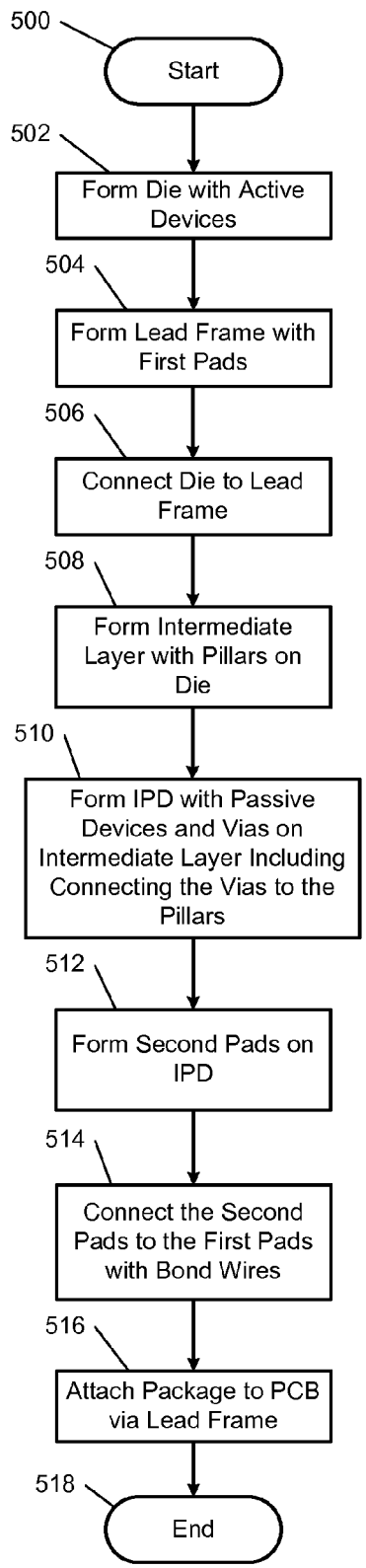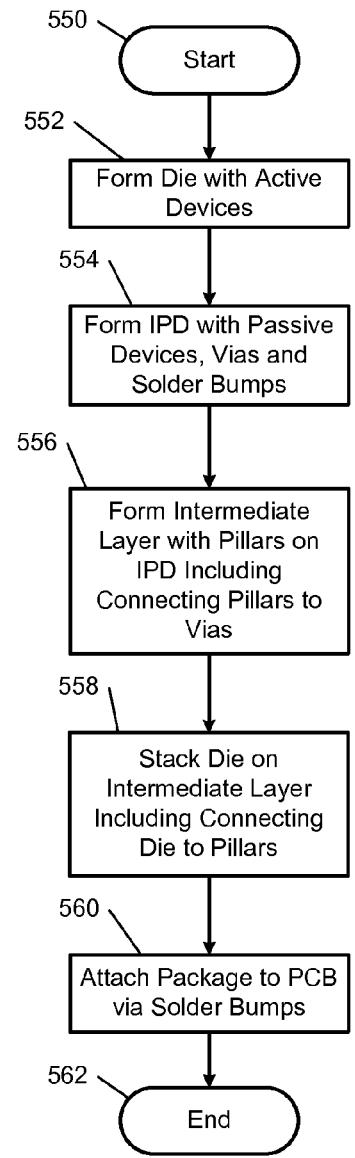
FIG. 10
FIG. 11

METHOD AND APPARATUS FOR INCORPORATING PASSIVE DEVICES IN AN INTEGRATED PASSIVE DEVICE SEPARATE FROM A DIE

CROSS-REFERENCE TO RELATED APPLICATIONS

This application claims the benefit of U.S. Provisional Application No. 61/943,226, filed on Feb. 21, 2014. The entire disclosure of the application referenced above is incorporated herein by reference.

FIELD

The present disclosure relates to wireless communication circuits, and more particularly to radio frequency transceiver circuits.

BACKGROUND

A wireless network device can include a physical layer module that includes a radio frequency (RF) switch circuit, a filter and an antenna. The RF switch circuit switches between (i) connecting a transmit circuit to the filter, and (ii) connecting a receive circuit to the filter. The filter is connected to an antenna and filters signals transmitted from or received by the antenna. The transmit circuit may include one or more amplifiers including a power amplifier. The receive circuit may include one or more amplifiers including a low noise amplifier. The physical layer module may include active devices (e.g., switches and amplifiers) and passive devices (e.g., inductances, transformer, capacitances, resistances, and couplers).

The RF switch circuit typically includes one or more impedance matching circuits. As an example, an impedance matching circuit may be provided between (i) the filter, and (ii) the transmit circuit and the receive circuit. The impedance matching circuit directs a high-power transmit signal from the transmit circuit to the antenna while at the same time preventing the high-power transmit signal from being received by the receive circuit.

SUMMARY

A circuit is provided and includes a first die, an integrated passive device and a second layer. The first die includes a first substrate and active devices. The integrated passive device includes a first layer, a second substrate and passive devices. The second substrate includes vias. The passive devices are implemented at least on the first layer or the second substrate. A resistivity per unit area of the second substrate is greater than a resistivity per unit area of the first substrate. The second layer is disposed between the first die and the integrated passive device. The second layer includes pillars. Each of the pillars connects a corresponding one of the active devices to (i) one of the vias, or (ii) one of the passive devices. The first die, the integrated passive device and the second layer are disposed relative to each other to form a stack.

In other features, a method is provided and includes: forming a die to include a first substrate and active devices; and forming an integrated passive device including a first layer, a second substrate and passive devices. The second substrate includes vias. The passive devices are implemented on at least the first layer or the second substrate. A resistivity per unit area of the second substrate is greater than a resistivity per unit area of the first substrate. A second layer is disposed between the die and the integrated passive device. The second layer includes pillars. The disposing of the second layer between the die and the integrated passive device includes: connecting each of the pillars to (i) a corresponding one of the active devices and to (ii) one of the vias or one of the passive devices; and connecting at least some of the pillars to corresponding ones of the vias. The die, the integrated passive device and the second layer are disposed relative to each other to form a stack.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 10 illustrates a method of manufacturing a bond wire package in accordance with the present disclosure.

FIG. 11 illustrates a method of manufacturing a flip chip package in accordance with the present disclosure.

In the drawings, reference numbers may be reused to identify similar and/or identical elements.

DESCRIPTION

Figure 1:
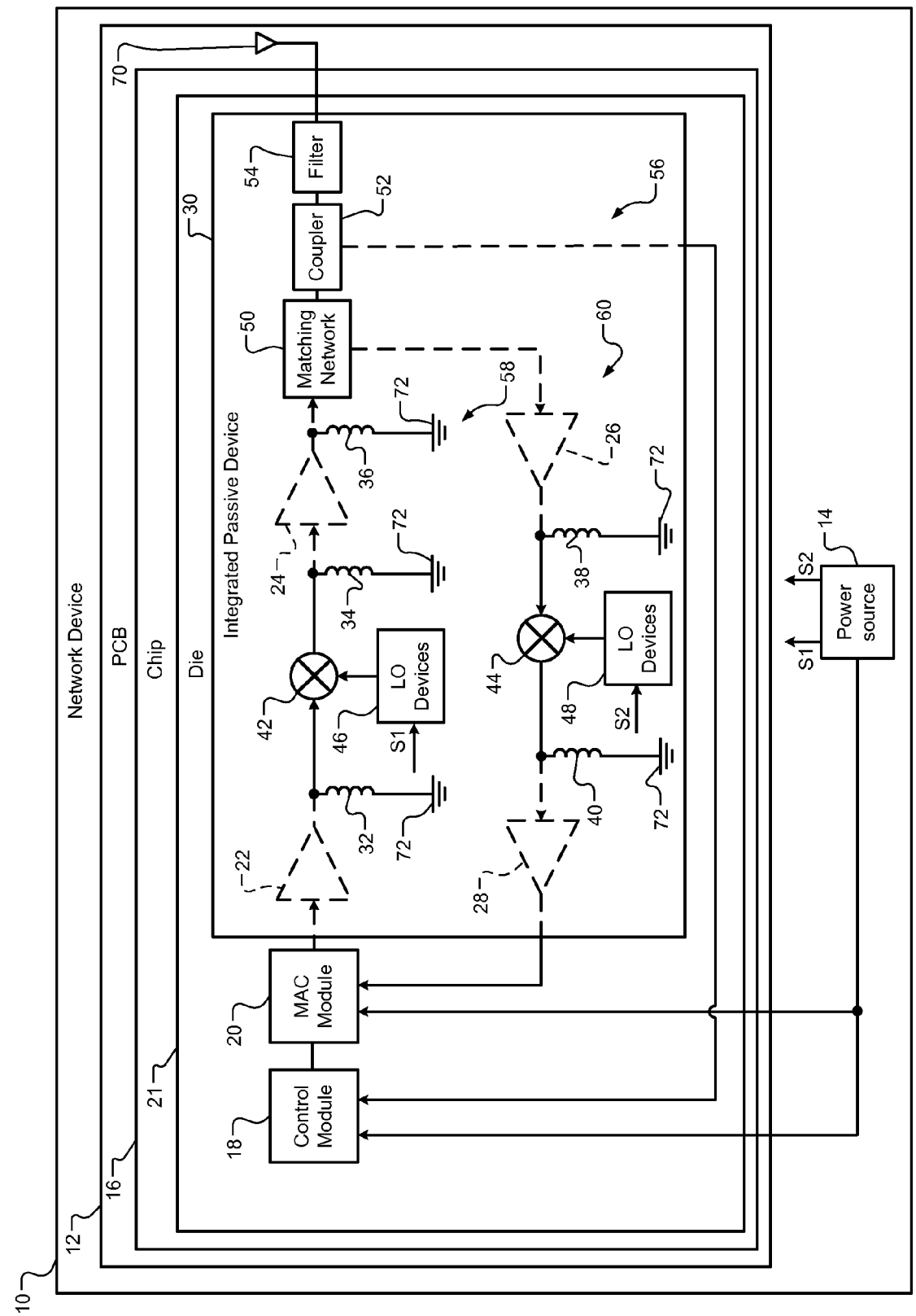
FIG. 1 is a functional block diagram of a network device including an integrated passive device with single-ended transmitter devices and single-ended receiver devices in accordance with the present disclosure.

The active devices and passive devices of a physical layer module of a wireless network device may be incorporated in a single chip. This is a two-dimensional implementation, as all of the active devices and the passive devices are implemented on a single chip. Incorporation of both passive devices and active devices on a single chip results in a highly lossy PHY module due to low resistivity of a substrate of a chip. The substrate (e.g., a P-tap substrate or a N-tap substrate) of a chip is doped to form active devices (e.g., transistors) on the substrate. This doping and/or composition of the substrate results in a substrate having low resistivity (e.g., 10 Ohms (Ω) per cm$^2$). Also, the passive devices, such as inductors take up a large amount of space (area) on the chip.

To decrease the amount of area on the chip utilized by the passive devices, a portion of the passive devices, such as a transformer, inductances, capacitances, and/or an impedance matching circuit (or network) may be implemented on a printed circuit board (PCB) separate from the chip. This is another two-dimensional implementation, as all of the active devices and passive devices are located on the chip or next to the chip on the PCB. The chip may include the remaining passive devices and the active devices. Some of the passive devices on the PCB may be connected to certain ones of the devices on the chip by bond wires. For example, a transformer on the PCB may be connected to switches, amplifiers, and/or a second impedance matching network on the chip. Although this provides space on the chip for additional devices, the corresponding PHY module is highly lossy due to the incorporation of the active devices and the passive devices on either the PCB or the chip. A PCB also has low resistivity.

A quality factor Q of a matching network device (e.g., an inductor) that is implemented on a chip or a PCB can be poor due to metal resistance and lossy properties of (i) silicon substrates in chips, and (ii) PCBs. The higher the lossy properties of a circuit, the lower the quality factor Q of a circuit. A poor quality factor Q results in limited transmit power and receive sensitivity performance.

The below described examples, include incorporation of (i) passive devices of a PHY module in one or more integrated passive devices (IPDs), and (ii) active devices of a PHY module in one or more dies. The IPDs and dies are disposed in various stacked arrangements. These arrangements are referred to as three-dimensional implementations, as the active devices and passive devices are implemented within one or more stacks. Each of the stacks includes one or more IPDs, one or more dies, active devices, and passive devices.

The disclosed IPDs include substrates with high resistivities (e.g., 1 Kilo-Ohm (kΩ) per cm$^2$), as compared to substrates of a die, chip and/or PCB. A chip may include, for example, a die and a lead frame and thus as referred to herein is not equivalent to a die. By having the passive devices in the IPDs, the passive devices experience less loss and additional space is available for other devices in the corresponding dies and/or chips. This improves corresponding quality factors and as a result transmission and reception performance.

FIG. 1 shows a network device 10. The network device 10, as well as other network devices disclosed herein, may refer to a computer, a tablet, a mobile device, a cellular phone, a router, an appliance, a tool, a global positioning system (GPS) device, and/or other network device. The network devices may wirelessly communicate with each other or other wireless network devices using Institute of Electrical and Electronic Engineers (IEEE), Wi-Fi™, Bluetooth®, and/or other wireless protocols. Wireless signals transmitted by the network devices may be radio frequency (RF) and/or frequency modulated (FM) signals. The wireless signals may be transmitted in, for example, the Industrial, Scientific and Medical (ISM) 2.4 GHz short-range radio frequency band or other suitable band.

The network device 10 may include a PCB 12 and a power source 14. The power source 14 may be attached to the PCB 12 and provide power to modules and corresponding devices of the network device 10. A chip 16 may be mounted on the PCB 12. The chip 16 may include a control module 18, a medium access control (MAC) module 20, and a die 21. The die 21 and other dies disclosed herein including the dies in FIGS. 1-9 may each be: a semiconductor die (e.g., a die that includes semiconductor devices, such as transistors); metal-oxide semiconductor (MOS); a complementary metal-oxide-semiconductor (CMOS) die; a silicon-on-insulator die (e.g., a die that has one or more layers of silicon and one or more insulative layers); a gallium arsenide (GaAs) die; a gallium nitride (GaN) die; a silicon germanium (SiGe) die, etc. As an example, a semiconductor die may include complementary metal-oxide semiconductor (CMOS) transistors. As another example, a silicon-on-insulator die may include metal-oxide-semiconductor field-effect transistors. The dies may include, GaAs, GaN, SiGe, and/or other suitable materials. The MOS and CMOS dies may have less resistivity and lower corresponding Q values than the silicon-on-insulator dies, GaAs dies, GaN dies, and SiGe dies.

Figure 3:
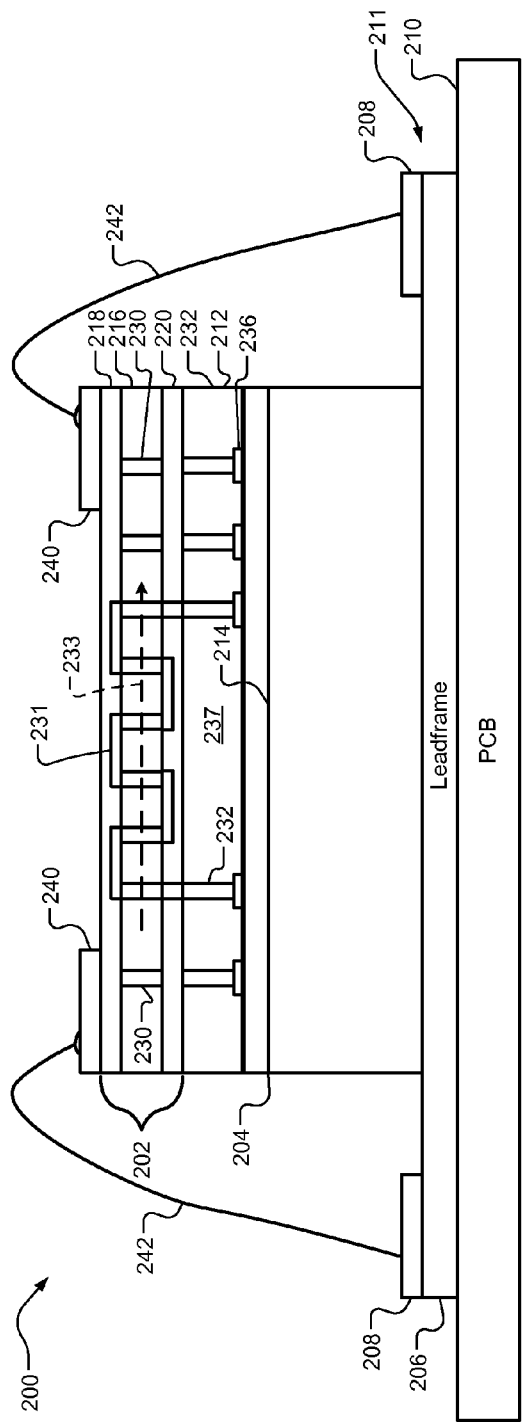
FIG. 3 is a cross-sectional side view of a bond wire package including an integrated passive device stacked on a die in accordance with the present disclosure.

The die 21 may include active devices, such as amplifiers 22, 24, 26, 28 and/or other active devices (e.g., transistors). An IPD 30 may be stacked on the die 21 and include passive devices, such as inductances 32, 34, 36, 38, 40, mixers 42, 44, local oscillator devices 46, 48, an impedance matching network 50 (hereinafter referred to as "the matching network 50"), a coupler 52, a filter 54, and/or other passive devices (e.g., capacitances and resistances). Each of the passive devices may be implemented in one or more layers of the IPD 30. An IPD may be referred to as a passive layer, which may include one or more layers as further described below. The IPD 30 may be stacked on the die 21, as shown in FIG. 3. Although the IPD 30 is shown as being stacked on the die 21 and the die is shown as being connected to the PCB 12, the die 21 may be stacked on the IPD 30 and the IPD 30 may be connected to the PCB 12. Various IPD and die stacked arrangements may be included, some of which are disclosed in FIGS. 3-9. The power source 14 may provide power to the control module 18, the MAC module 20 and the local oscillator devices 46, 48.

The active devices and the passive devices may be part of a physical layer (PHY) module (designated 56). The PHY module 56 includes a transmitter circuit (or path) 58 and a receiver circuit (or path) 60. The transmitter circuit 56 includes single-ended transmitter devices including the amplifiers 22, 24, the inductances 32, 34, 36, the mixer 42, and the local oscillator devices 46. The transmitter devices may include the matching network 50, the coupler 52 and/or the filter 54. The receiver circuit 60 includes single-ended receiver devices including the amplifiers 26, 28, inductances 38, 40, mixer 44, and local oscillator devices 48. The receiver circuit 60 may include the matching network 50, the coupler 52 and/or the filter 54. One or more of the passive devices of the IPD 30 and the other passive devices of other IPDs disclosed herein may be implemented in the IPD or may be implemented external to the IPDs as lumped components. The lumped components may include, for example, one or more inductances, capacitances, resistances, mixers, local oscillator devices, couplers, filters, matching network devices, etc. Lumped components refer to small circuit elements having predetermined sizes or scales. For example, lumped components may have industry standard sizes between 2512 (25 hundredths of an inch long and 12 hundredths of an inch wide) to as small as 0201 (2 hundredths of an inch long to 1 hundredth of an inch wide). The sizes may also be in metric units. The lumped components may be mounted on a PCB and connected to the IPDs and/or corresponding dies.

The amplifiers 22, 24, 26, 28 are shown with dashed lines to indicate that the amplifiers 22, 24, 26, 28 are located in the die 21 and not in the IPD 30. The inductances 32, 34, 36, 38, 40, mixers 42, 44, local oscillator devices 46, 48, matching network 50, coupler 52 and filter 54 are shown with solid lines to indicate that these items may be located in the IPD 30 and not in the die 21.

The matching network 50, the coupler 52 and/or the filter 54 may not be included in the IPD 30 and/or the network device 10. For example, the amplifier 24, the inductance 36, and the amplifier 26 may be directly connected to the matching network 50, the coupler 52, the filter 54, or an antenna 70. The antenna 70 may be implemented on the PCB 12 as shown or in the chip 16. Wireless signals are transmitted from and received by the antenna 70. The matching network 50 may be included to provide impedance matching between (i) the amplifiers 24, 26 and inductance 36 and (ii) the coupler 52, filter 54, and/or antenna 70. Although the matching network 50, the coupler 52 and the filter 54 are shown in a particular order, these devices may be in a different order. For example, the coupler 52 may be connected between the amplifier 24 and the matching network 50.

The coupler 52 may be a directional coupler that is used to tap energy out of the amplifier 24 and/or matching network 50 during transmission of a wireless signal. The control module 18 may determine power out of the amplifier 24 and/or matching network 50 based on power received from the coupler 52. As an alternative, the MAC module 20 may be connected to the coupler 52 and determine power out of the amplifier 24 and/or the matching network 50 during transmission of a wireless signal.

The oscillator devices 46, 48 may include voltage controlled oscillators. The voltage controlled oscillators may include inductance/capacitance (LC) tank networks. For example, each of the voltage controlled oscillators may include an inductance connected in parallel with a capacitance.

The amplifier 22 is connected to an output of the MAC module 20. The inductance 32 may be connected between an output of the amplifier 22 and a reference terminal 72, which may be at a ground potential or other reference potential. The mixer 42 is connected between (i) the amplifier 22 and the inductance 32 and (ii) the amplifier 24 and the inductance 34. The amplifier 24 is connected between the (i) mixer 42 and the inductance 34 and (ii) the inductance 36 and the matching network 50. The inductances 34 and 36 may be connected to the reference terminal 72.

The amplifier 26 is connected to an output of the matching network 50. The inductance 38 is connected between (i) an output of the amplifier 26 and (ii) the reference terminal 72. The mixer 44 is connected between (i) the amplifier 26 and the inductance 38 and (ii) the amplifier 28 and the inductance 40. The inductances 38, 40 may be connected to the reference terminal 72. The amplifier 28 is connected between (i) the mixer 44, the inductance 40 and (ii) the MAC module 20.

During transmission, the control module 18 may output data to the MAC module 20. The MAC module 20 may generate an initial signal having frames (or packets), which include the data. The amplifier 22 amplifies the initial signal to generate an amplified signal. The mixer 42, based on a local oscillator signal having a local oscillator frequency and received from the local oscillator devices 46, upconverts the amplified signal to a RF signal. The amplifier 24 may be a power amplifier and amplify an upconverted signal out of the mixer 42. An amplified signal out of the amplifier 24 is filtered by the filter 54 and transmitted by the antenna 70.

During reception, the antenna 70 receives a wireless signal, which is filtered by the filter 54. The amplifier 26 amplifies a filtered signal out of the filter 54, coupler 52 or matching network 50. An amplified signal out of the amplifier 26 is downconverted to a baseband signal by the mixer 44. The mixer 44 performs the downconversion based on a local oscillator signal from the local oscillator devices 48. The amplifier 28 amplifies a downconverted signal out of the mixer 44. An amplified signal out of the amplifier 28 is provided to the MAC module 20.

Figure 2:
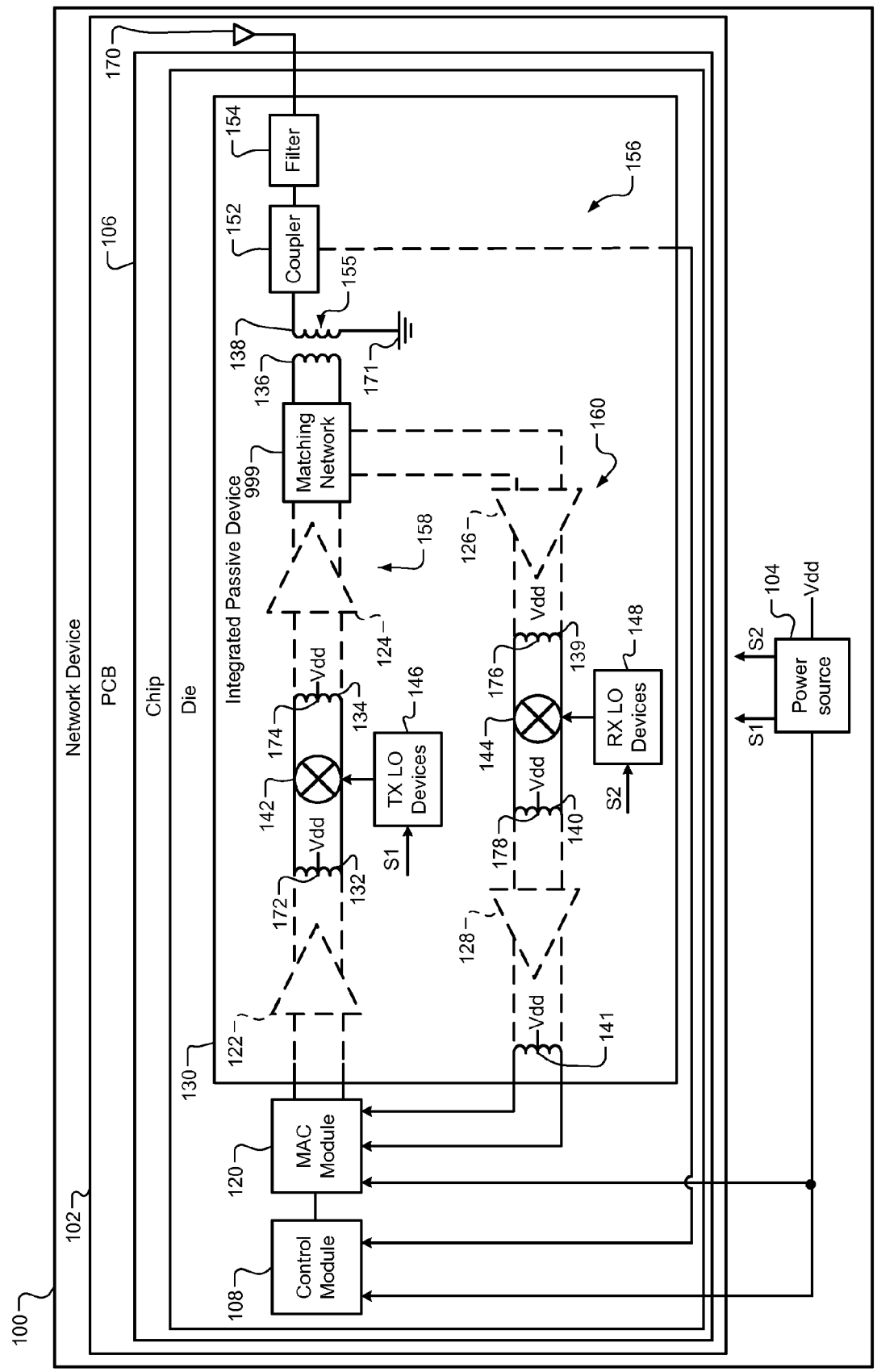
FIG. 2 is a functional block diagram of a network device including an integrated passive device with differential transmitter devices and differential receiver devices in accordance with the present disclosure.

FIG. 2 shows another network device 100 may include a PCB 102 and a power source 104. The power source 104 may be attached to the PCB 102 and provide power to modules and corresponding devices of the network device 100. A chip 106 may be mounted on the PCB 102. The chip 106 may include a control module 108, a MAC module 120, and a die 121. The die may include active devices, such as amplifiers 122, 124, 126, 128 and/or other active devices (e.g., transistors). An IPD 130 may be stacked on the chip 106 and include passive devices, such as inductances 132, 134, 136, 138, 139, 140, 141, mixers 142, 144, local oscillator devices 146, 148, an impedance matching network 150 (hereinafter referred to as "the matching network 150"), a coupler 152, a filter 154 and/or other passive devices (e.g., capacitances and resistances). Each of the passive devices may be implemented in one or more layers of the IPD 130. The IPD 30 may be stacked on the die 121, as shown in FIG. 3. Although the IPD 130 is shown as being stacked on the die 121, the die 121 may be stacked on the IPD 130 and the IPD 130 may be connected to the PCB 102. Various IPD and chip stacked arrangements may be included, some of which are disclosed in FIGS. 3-9. The power source 104 may provide power to the control module 108, the MAC module 120 and the local oscillator devices 146, 148.

The active devices and the passive devices may be part of a PHY module (designated 156). The PHY module 156 includes a transmitter circuit (or path) 158 and a receiver circuit (or path) 160. The transmitter circuit 156 includes differential transmitter devices including the amplifiers 122, 124, the inductances 132, 134, 136, 138, the mixer 142, the local oscillator devices 146. The transmitter devices may include the matching network 150, the coupler 152 and/or the filter 154. The receiver circuit 160 includes differential receiver devices including the amplifiers 126, 128, inductances 136, 138, 139, 140, 141, mixer 144, and local oscillator devices 148. The receiver circuit 160 may include the matching network 150, the coupler 152 and/or the filter 154. The inductances 136, 138 may be primary and secondary inductances of a transformer (designated 155). The transformer 155 may be implemented as and/or include a balun, which converts a differential signal to a single-ended signal for transmission by an antenna. The balun may be included in the matching network 150. If an impedance ratio between the receive circuit 160 and the antenna is high, the matching network 150 and/or balun is included for impedance transformation.

The amplifiers 122, 124, 126, 128 are shown with dashed lines to indicate that the amplifiers 122, 124, 126, 128 are located in the die 121 and not in the IPD 130. The inductances 132, 134, 136, 138, 139, 140, 141, mixers 142, 144, local oscillator devices 146, 148, matching network 150, coupler 152 and filter 154 are shown with solid lines to indicate that these items may be located in the IPD 130 and not in the die 121.

The matching network 150, the coupler 152 and/or the filter 154 may not be included in the IPD 130 and/or the network device 100. For example, the amplifier 124 and the amplifier 126 may be directly connected to the matching network 50 or the inductance 136 (or corresponding transformer). The inductance 138 (or corresponding transformer) may be directly connected to the coupler 152, the filter 154, or an antenna 170. The inductance 138 is connected to a reference terminal 171 that is at a reference potential. The antenna 170 may be implemented on the PCB 102 as shown or in the chip 106. Wireless signals are transmitted from and received by the antenna 170. The matching network 150 may be included to provide impedance matching between (i) the amplifiers 124, 126 and (ii) the inductance 136 or transformer 155. Although an impedance matching network is shown between the amplifiers 124, 126 and the transformer 155, an impedance matching network may alternatively or in addition be located between the transformer 155 and the coupler 152, filter 154, and/or antenna 170. The matching network 150 may not be included and the amplifiers 124, 126 may be directly connected to the inductance 136. Although the transformer 155, the coupler 152 and the filter 154 are shown in a particular order, these devices may be in a different order.

The coupler 152 may be a directional coupler that is used to tap energy out of the transformer 155 during transmission of a wireless signal. The control module 108 may determine power out of the transformer 155 based on power received from the coupler 152. As an alternative, the MAC module 120 may be connected to the coupler 152 and determine power out of the transformer 155 during transmission of a wireless signal.

The oscillator devices 146, 148 may include voltage controlled oscillators. The voltage controlled oscillators may include inductance/capacitance (LC) tank networks. For example, each of the voltage controlled oscillators may include an inductance connected in parallel with a capacitance.

The amplifier 122 is connected to an output of the MAC module 120. The inductance 132 may be connected to outputs of the amplifier 122. The mixer 42 is connected between the inductance 132 and the inductance 134. The inductances 132, 134 may have center taps 172, 174 connected to a power supply terminal that is at a potential Vdd. The amplifier 124 is connected between the inductance 134 and the matching network 150.

The amplifier 126 is connected to an output of the matching network 150. The inductance 139 is connected between (i) outputs of the amplifier 126 and (ii) the mixer 144. The mixer 144 is connected between (i) the amplifier 126 and the inductance 139 and (ii) the inductance 140. The inductances 38, 40 may have center taps 176, 178 connected to the power supply terminal that is at the potential Vdd. The amplifier 128 is connected between the inductance 140 and the inductance 141. The inductance 141 is connected between the amplifier 128 and inputs of the MAC module 120.

During transmission, the control module 108 may output data to the MAC module 120. The MAC module 120 may generate an initial signal having frames (or packets), which include the data. The amplifier 122 amplifies the initial signal to generate an amplified signal. The mixer 142, based on a local oscillator signal having a local oscillator frequency and received from the local oscillator devices 146, upconverts the amplified signal to a RF signal. The amplifier 124 may be a power amplifier and amplify an upconverted signal out of the mixer 142. An amplified signal out of the amplifier 124 is transformed by the transformer 155 (e.g., transformed from having a first voltage to having a second voltage), filtered by the filter 154, and transmitted by the antenna 170.

During reception, the antenna 170 receives a wireless signal, which is filtered by the filter 154. The amplifier 126 amplifies a filtered signal out of the filter 154, coupler 152, transformer 155, or matching network 150. An amplified signal out of the amplifier 126 is downconverted to a baseband signal by the mixer 144. The mixer 144 performs the downconversion based on a local oscillator signal from the local oscillator devices 148. The amplifier 128 amplifies a downconverted signal out of the mixer 144. An amplified signal out of the amplifier 128 is provided to the MAC module 120.

FIG. 3 shows a bond wire package 200 including an IPD 202 stacked on a die 204. The die 204 is disposed on a leadframe 206. The leadframe 206 may be a pin grid array (PGA) package, a quad flat non-leaded (QFN) package or other package. The leadframe 206 has first pads 208 and may be mounted on a PCB 210. An intermediate layer 212 may be disposed between the IPD 202 and the die 204 and connect the IPD 202 to the die 204. The IPD 202, the die 204, and the intermediate layer 212 may replace the IPD and die shown in FIG. 1 and/or FIG. 2. The PCB 210 may replace the PCB shown in FIG. 1 and/or FIG. 2.

The die 204 may include a first substrate 214. The IPD 202 may include a second substrate 216. The first substrate 214 may be a P-tap or N-tap substrate, which is doped for formation of active devices (e.g., transistors and amplifiers) thereon. As an example, the transistors of the first substrate 214 may be CMOS transistors. The second substrate 216 may not be doped and is configured for passive devices. The second substrate 216 may have one or more metallization layers formed thereon. Example metallization layers 218, 220 are shown. The second substrate 216 may have any number of metallization layers and/or insulation layers disposed (i) on the second substrate 216, and/or (ii) under the second substrate 216 between the second substrate and the intermediate layer 212. The metallization layers may include passive devices (e.g., the passive devices shown in FIGS. 1-2), portions of passive devices, and/or interconnect devices (e.g., couplers, jumpers, traces, etc.). The second substrate 216 may have higher resistivity than the first substrate 214 and the PCB 210. As an example, the second substrate 216 may have a resistivity of 1 kΩ/cm$^2$. The first substrate 214 may have a resistivity of 10 Ω/cm$^2$. The first substrate 214 may be formed of silicon. The second substrate 216 may be formed of silicon and/or glass. The second substrate 216 may have more glass per cm$^2$ than the first substrate 214 and/or the PCB 210. In one implementation, the substrate 214 does not have a higher resistivity than the second substrate 216.

The first substrate 214 and other substrates of dies disclosed herein including the dies in FIGS. 1-9 may each be: a semiconductor substrate (e.g., a substrate that has corresponding semiconductor devices, such as transistors); metal-oxide semiconductor (MOS); a complementary metal-oxide-semiconductor (CMOS) substrate; a silicon-on-insulator substrate (e.g., a substrate that has one or more layers of silicon and one or more insulative layers); a gallium arsenide (GaAs) substrate; a gallium nitride (GaN) substrate; a silicon germanium (SiGe) substrate, etc. As an example, a semiconductor substrate may have corresponding complementary metal-oxide semiconductor (CMOS) transistors. As another example, a silicon-on-insulator substrate may have corresponding metal-oxide-semiconductor field-effect transistors. The substrates may include, GaAs, GaN, SiGe, and/or other suitable materials. The MOS and CMOS substrates may have less resistivity and lower corresponding Q values than the silicon-on-insulator substrates, GaAs substrates, GaN substrates, and SiGe substrates.

The IPD 202 includes the second substrate 216 and the metallization layers 218, 220. As shown, the second substrate 216 is disposed between the metallization layers 218, 220. The second substrate 216 may include vias 230. The vias 230 may be through glass vias (TGVs) or through silicon vias (TSVs). The vias 230 may connect the first metallization layer and/or passive devices on the first metallization layer 218 to the second metallization layer and/or passive devices on the second metallization layer 220. Each of the passive devices may be implemented on one or more layers of the IPD 202. As an example, an inductance 231 is shown as being implemented in the IPD 202. The inductance 231 may include traces (or conductive elements) in the metallization layers 218, 220 and some of the vias 230. Any of the inductances of FIGS. 1-2 may be implemented in layers of an IPD 202, similar to the inductance 231. Due to the configuration of the inductance 231 having conductive elements on multiple layers as shown, a magnetic field generated by the inductance 231 may be directed in a direction laterally across the IPD 202 (this is shown by arrow 233), as opposed to in a direction towards the die 204. This prevents the magnetic field generated by the inductance 231 from affecting the active devices and/or corresponding signals in the die 204, which reduces interference experienced by the active devices. If an inductance were to be implemented as a planar structure in the IPD 202, then the inductance may generate a magnetic field that is directed perpendicular to and towards the die 204, which would result in interference.

The intermediate layer 212 includes pillars 232. The pillars 232 connect the vias 230 and/or passive devices in the metallization layers 218, 220 to devices in the die 204. The metallization layer 218 may include conductive elements that connect some of the vias 230 to the pillars 232. The pillars may be formed of one or more conductive materials (e.g., copper Cu). The intermediate layer 212 may include pads 236. The pads 236 may be disposed between the pillars 232 and the die 204, as shown, or may be disposed between the pillars 232 and the IPD 202. The pads 236 may be formed of one or more conductive materials (e.g., aluminum Al). The intermediate layer 212 may include insulative material (designated 237), which surrounds the pillars 232. As an alternative, the pillars 232 may stand alone without insulative material surrounding the pillars 232. In this example alternative, an intermediate layer is not disposed between the IPD 202 and the die 204, but rather simply pillars and/or any corresponding coupling elements (e.g., pads) are disposed between the IPD 202 and the die 204.

A cross-sectional area of the IPD 202 may be different than the cross-sectional area of the die 204. As an example, the cross-sectional area of the IPD 202 may be larger than the cross-sectional area of the die 204, such that the IPD 202 overhangs the die 204 in one or more directions.

Additional pads 240 may be disposed on the IPD 202. The pads 240 may be connected to the first pads 208 by bond wires 242. The pads 240 may be connected to the metallization layer 218 and/or passive devices in the metallization layer 218.

Figure 4:
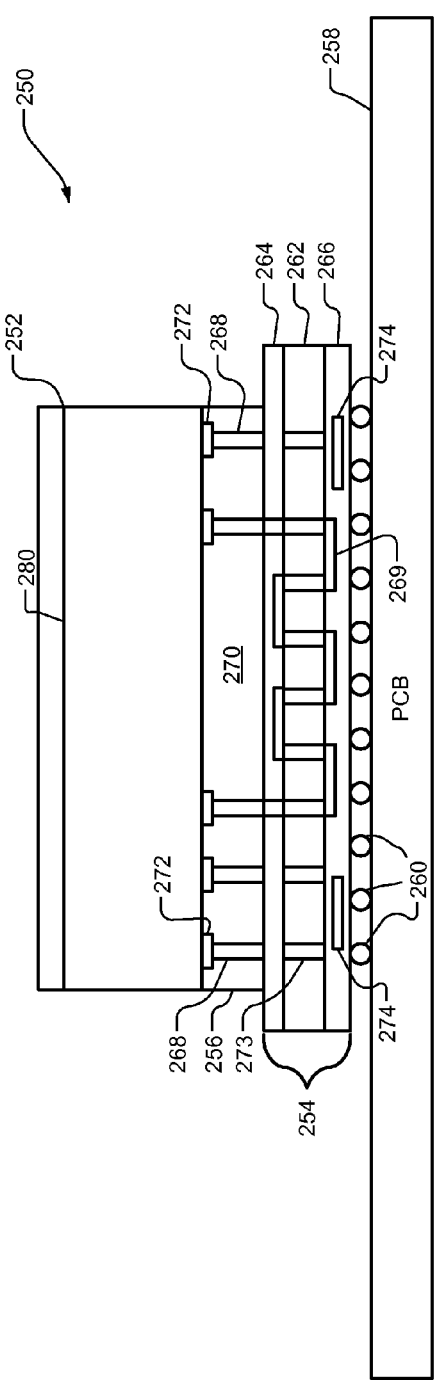
FIG. 4 is a cross-sectional side view of a flip chip package including a die stacked on an integrated passive device in accordance with the present disclosure.

FIG. 4 shows a flip chip package 250 including a die 252 stacked on an IPD 254. An intermediate layer 256 may be disposed between the die 252 and the IPD 254. The IPD 254 may be mounted on a PCB 258 and connected to the PCB 258 by solder balls 260. The die 252 may include active devices. The IPD 254 may include a substrate 262 and one or more metallization layers 264, 266. The metallization layers 264, 266 may include passive devices, portions of passive devices, and/or interconnect devices. An inductance 269 is shown as an example.

The intermediate layer 256 may include pillars 268 and insulative material 270. As an alternative, the pillars 268 may stand alone without insulative material surrounding the pillars 268. The intermediate layer 256 may also include pads 272, which may be disposed between the pillars 268 and the die 252 or between the pillars 268 and the metallization layer 264. The IPD 254 may include vias 273 (e.g., TGVs and/or TSVs). The vias 273 may be connected to the pillars 268. The metallization layers 264, 266 may include interconnect devices (interconnect devices 274 are shown).

The die 252 may include a first substrate 280. The IPD 254 may include the substrate 262. The first substrate 280 may be a P-tap or N-tap substrate, which is doped for formation of active devices (e.g., transistors and amplifiers) thereon. As an example, the transistors of the first substrate 280 may be CMOS transistors. The second substrate 262 may not be doped and is configured for passive devices. The second substrate 262 may have one or more metallization layers formed thereon, as shown. The second substrate 262 may have any number of metallization layers and/or insulation layers disposed (i) on the second substrate 262, and/or (ii) under the second substrate 262 between the second substrate and the intermediate layer 256. The metallization layers may include passive devices (e.g., the passive devices shown in FIGS. 1-2) and/or interconnect devices (e.g., couplers, jumpers, traces, etc.). Each of the passive devices may be implemented on one or more layers of the IPD 254. The second substrate 262 may have higher resistivity than the first substrate 280 and the PCB 258. As an example, the second substrate 262 may have a resistivity of 1 k$\Omega$/cm$^2$. The first substrate 280 may have a resistivity of 10 $\Omega$/cm$^2$. The first substrate 280 may be formed of silicon. The second substrate 262 may be formed of silicon and/or glass. The second substrate 262 may have more glass per cm$^2$ than the first substrate 280 and/or the PCB 258.

Figure 5:
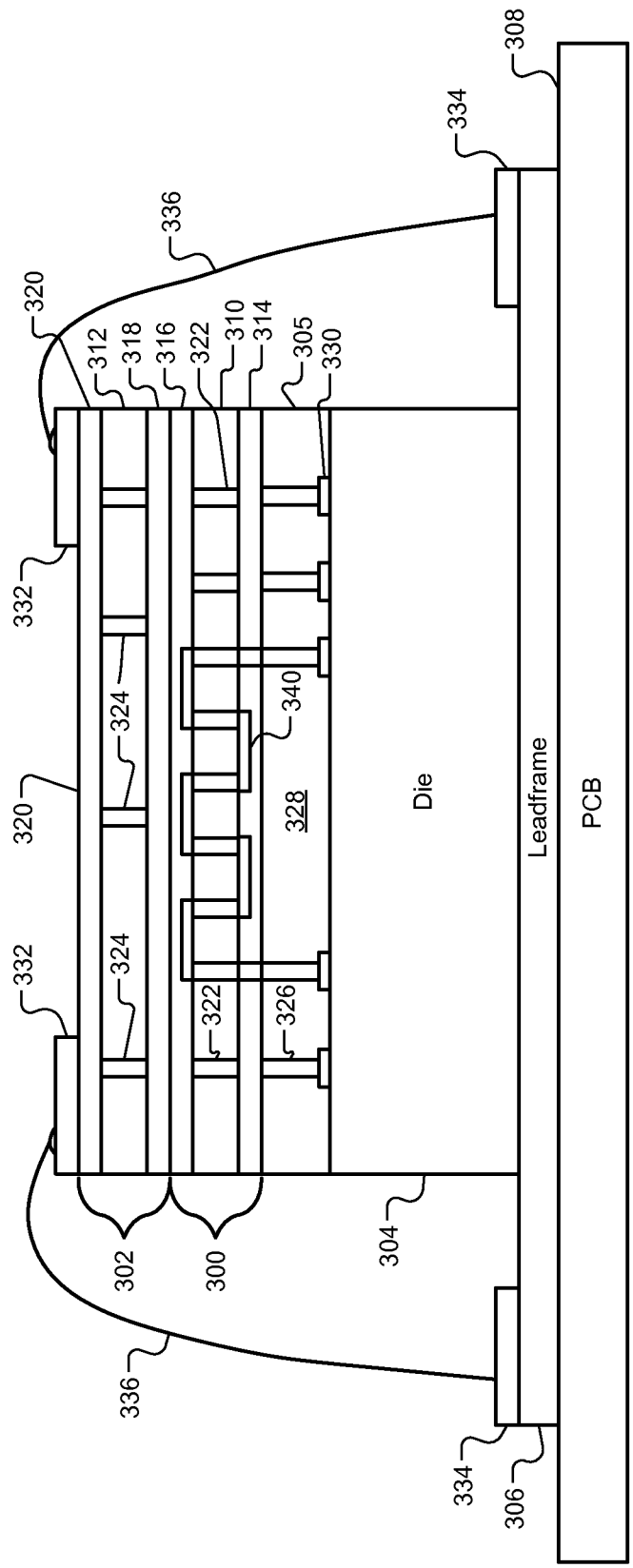
FIG. 5 is a cross-sectional side view of multiple integrated passive devices stacked on a die in accordance with the present disclosure.

Additional stacked IPD and die arrangements are shown in FIGS. 5-9. The dies may include active devices and the IPDs may include passive devices. The active device and the passive devices may include respectively the active devices and the passive devices of FIGS. 1-2. FIG. 5 shows multiple IPDs 300, 302 stacked on a die 304. An intermediate layer 305 is disposed between the IPD 300 and the die 304. The die is mounted on a leadframe 306, which is mounted on a PCB 308. The IPDs 300, 302 include respective substrates 310, 312, metallization layers 314, 316, 318, 320, and vias 322, 324. The intermediate layer 305 may include pillars 326 and insulative material 328. As an alternative, the pillars 326 may stand alone without insulative material surrounding the pillars 326. The intermediate layer 305 may include pads 330. Pads 332 may be disposed on the IPD 302 and may be connected to pads 334 on the leadframe 306. The pads 332 are connected to the pads 334 by bond wires 336. As an example, an inductance 340 is shown as being implemented in the IPD 300.

Figure 6:
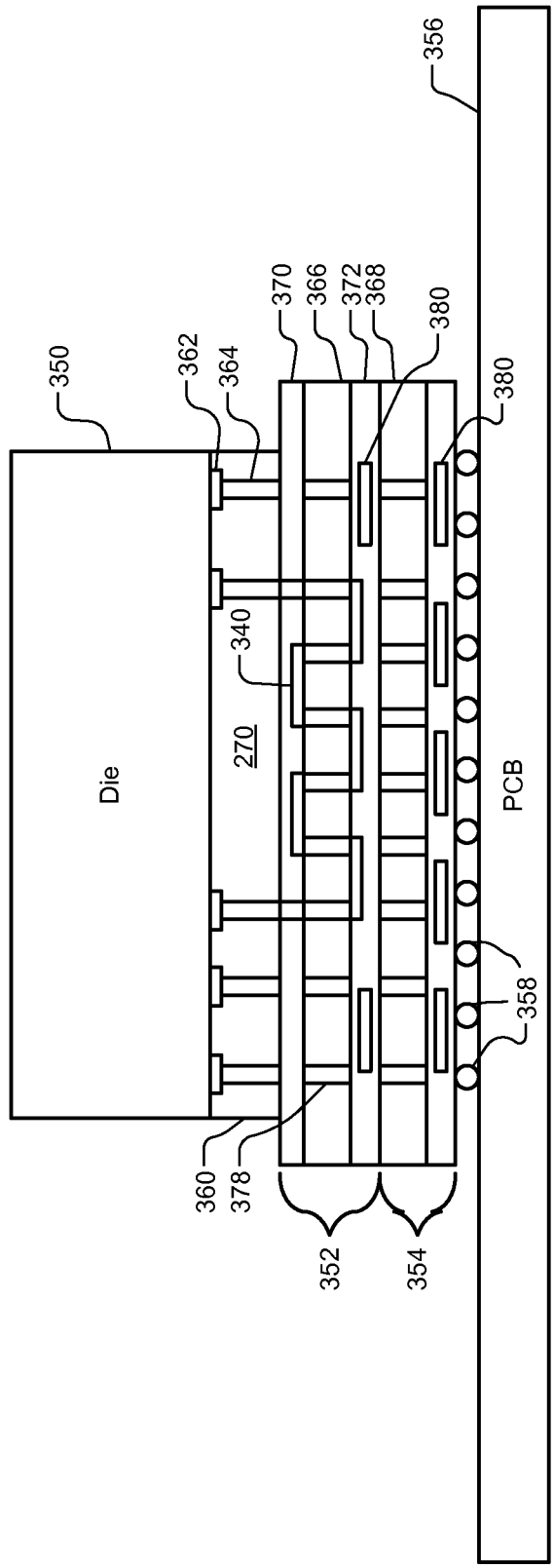
FIG. 6 is a cross-sectional side view of a die and multiple stacked integrated passive devices in accordance with the present disclosure.

FIG. 6 shows a die 350 and multiple stacked IPDs 352, 354. The IPD 354 is mounted on a PCB 356 and connected to the PCB by solder balls 358. The die 350 is stacked on an intermediate layer 360, which is stacked on the IPDs 352, 354. The intermediate layer 360 includes pads 362 and pillars 364. The IPDs 352, 354 include substrates 366, 368, metallization layers 370, 372, 374, and vias 378. The metallization layers may include interconnect devices 380.

Figure 7:
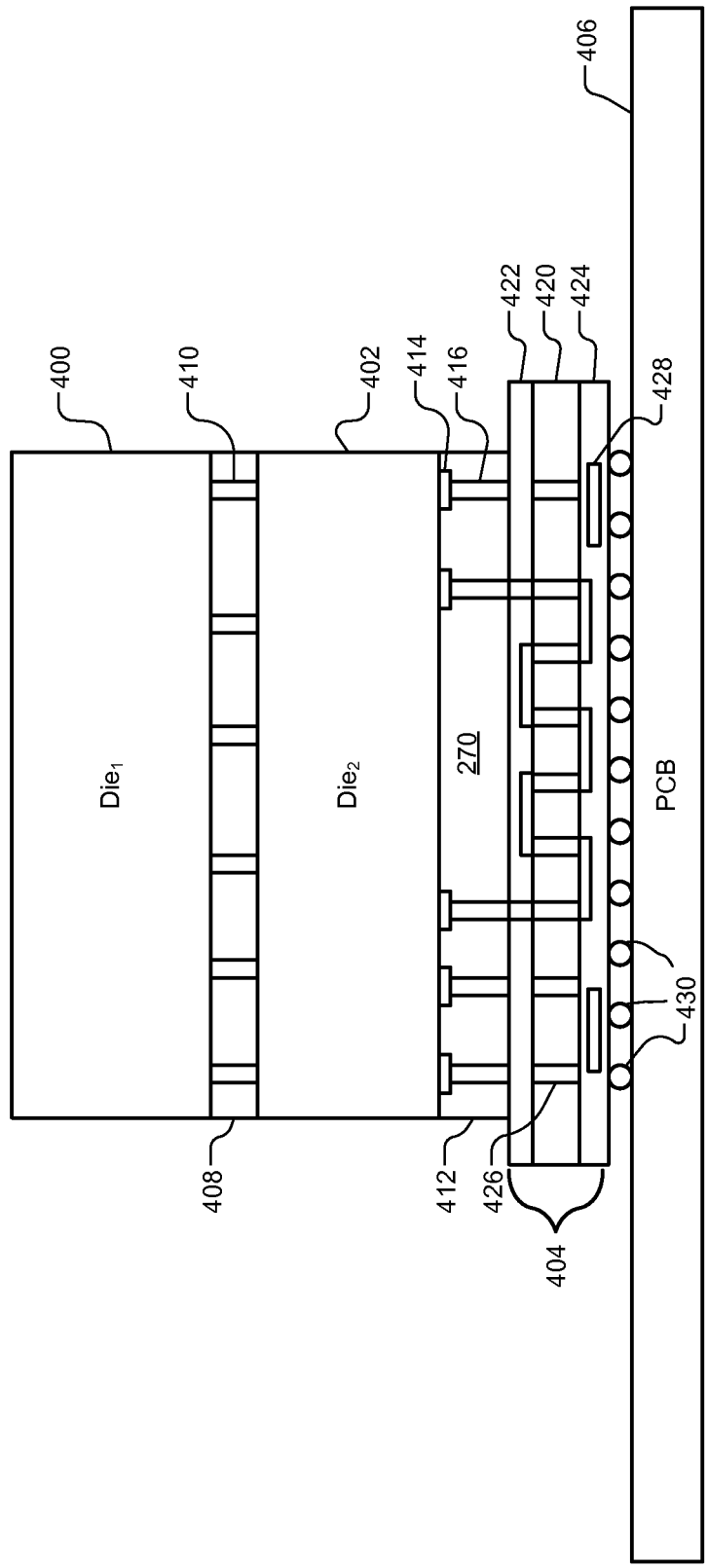
FIG. 7 is a cross-sectional side view of multiple dies stacked on an integrated passive device in accordance with the present disclosure.

FIG. 7 shows multiple dies 400, 402 stacked on an IPD 404. Die 400 is stacked on die 402, which is stacked on IPD 404. The IPD 404 is mounted on a PCB 406. A first intermediate layer 408 is disposed between the dies 400, 402. The first intermediate layer 408 includes pillars 410. A second intermediate layer 412 is disposed between the die 402 and the IPD 404. The second intermediate layer 412 includes pads 414 and pillars 416. The IPD 404 includes a substrate 420 and metallization layers 422, 424. The substrate 420 may include vias 426. The metallization layers 422, 424 may include interconnect devices 428. As an example, an inductance 430 is shown as being implemented in the IPD 404. The IPD 404 is connected to the PCB 406 by solder balls 430.

Figure 8:
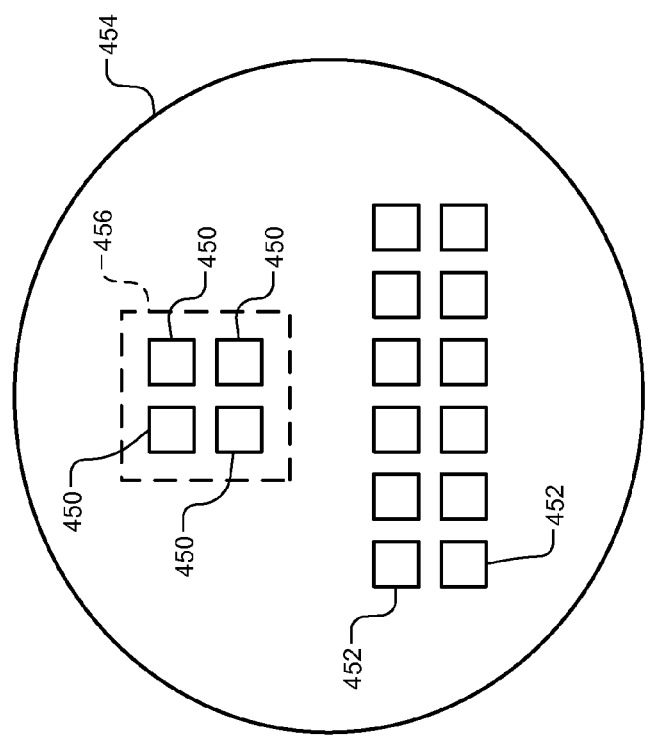
FIG. 8 is a top view of dies stacked on a wafer in accordance with the present disclosure.

FIG. 8 shows dies 450, 452 stacked on a wafer 454 (e.g., a wafer having an 8 inch diameter). The wafer may include silicon and/or glass. The wafer may be cut to include, for example, the dies 450 in a single package. The portion of the wafer 454 that is included in the single package may be implemented as an IPD and/or include an IPD. The portion of the wafer that is implemented as an IPD may be referred to as a wafer level chip scale package (WLCSP). The WLCSP may include a substrate and metallization layers of the IPD. A WLCSP may be associated with one or more dies. As an example, four dies 450 are shown as being part of a WLCSP, which includes a portion 456 of the wafer 454. The portion 456 is cut out from the wafer 454.

Figure 9:
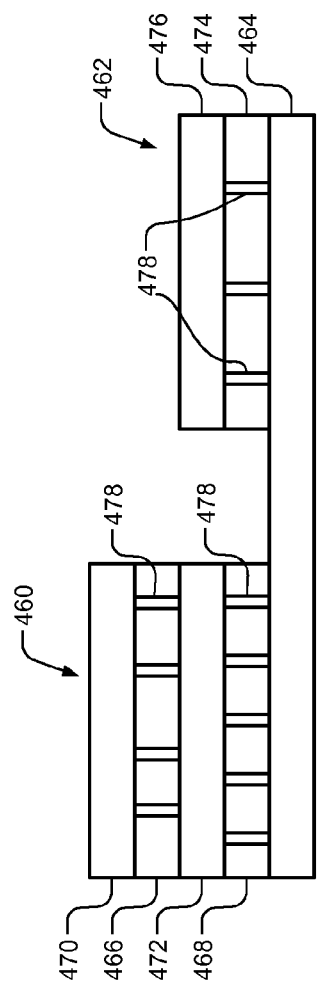
FIG. 9 is a cross-sectional side view of stacked integrated passive devices and dies in accordance with the present disclosure.

FIG. 9 shows stacked IPDs and dies. The IPDs and dies disclosed herein may be stacked in various arrangements. One or more IPDs and/or one or more dies may be stacked on an IPD. Similarly, one or more IPDs and/or one or more dies may be stacked on a die. One or more stacks of IPDs and/or dies may be disposed on an IPD. Similarly, one or more stacks of IPDs and/or dies may be disposed on a die. Each of the stated stacks may include one or more IPDs and/or one or more dies.

In the example of FIG. 9, two stacks 460, 462 of layers are shown on a base layer 464. The base layer 464 may be an IPD or a die. The first stack 460 includes intermediate layers 466, 468 and substrate layers 470, 472. The second stack 462 includes an intermediate layer 474 and a substrate layer 476. Each of the intermediate layers 466, 468, 474 may include pillars (collectively designated 478). Each of the substrate layers 470, 472, 476 may be an IPD or a die. Although not shown in FIG. 9, each of the substrate layers 470, 472, 476 may include vias.

The circuits disclosed herein may be manufactured and/or assembled using numerous methods, example methods are illustrated in FIGS. 10-11. FIG. 10 shows a method of manufacturing a bond wire package. Although the following tasks are primarily described with respect to the implementations of FIG. 3, the tasks may be easily modified to apply to other implementations of the present disclosure. The tasks may be iteratively performed.

The method may begin at 500. At 502, the die 204 may be formed having corresponding active devices. At 504, the leadframe 206 may be formed with the pads 208. At 506, the die 204 is connected to the leadframe 206. At 508, the intermediate layer 212 is formed on the die 204. This may include connecting the pillars 232 to the active components or other components of the die 204.

At 510, the IPD 202 is formed or disposed on the intermediate layer 212. This may include connecting the vias 216 of the IPD 202 to the pillars 232. The IPD 202 includes passive devices that may be connected to the vias 216. At 512, the pads 240 are formed on the IPD. At 514, the pads 240 are connected by the bond wires 242 to the pads 208. At 516, the package (e.g., chip scale package) formed by tasks 502-514 may be attached to the PCB 210 by the leadframe 206.

FIG. 11 shows a method of manufacturing a flip chip package. Although the following tasks are primarily described with respect to the implementations of FIG. 4, the tasks may be easily modified to apply to other implementations of the present disclosure. The tasks may be iteratively performed.

The method of FIG. 11 may begin at 550. At 552, the die 252 is formed and includes active devices. At 554, the IPD 254 is formed. The IPD 254 includes passive devices, the vias 273 and the solder balls 260 (may be referred to as solder bumps). At 556, the intermediate layer 256 is formed on the IPD 254. This may include connecting the pillars 268 to the vias 273.

At 558, the die 252 may be stacked on and connected to the intermediate layer 256. This may include connecting the die 252 to the pillars 268. At 560, the package (e.g., chip scale package) formed by performing tasks 552-558 may be attached to the PCB 258 by the solder balls 260.

The above-described tasks of FIGS. 10-11 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The wireless communications described in the present disclosure can be conducted in full or partial compliance with IEEE standard 802.11-2012, IEEE standard 802.16-2009, IEEE standard 802.20-2008, and/or Bluetooth® Core Specification v4.0. In various implementations, Bluetooth® Core Specification v4.0 may be modified by one or more of Bluetooth® Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A circuit comprising:
   a first die comprising a first substrate and a plurality of active devices;
   an integrated passive device comprising a first layer, a second substrate and a plurality of passive devices, wherein the second substrate comprises a plurality of vias, wherein the plurality of passive devices comprise an inductance, wherein the inductance is defined by (i) a plurality of layers of the integrated passive device including the first layer and the second substrate, and (ii) the plurality of vias, and wherein the plurality of passive devices are implemented at least on the first layer or the second substrate, and wherein a resistivity per unit area of the second substrate is greater than a resistivity per unit area of the first substrate; and
   a second layer disposed between the first die and the integrated passive device, wherein the second layer comprises a plurality of pillars, wherein each of the plurality of pillars connects a corresponding one of the plurality of active devices to (i) one of the plurality of vias, or (ii) one of the plurality of passive devices,
   wherein the first die, the integrated passive device and the second layer are disposed in a parallel arrangement relative to each other to form a stack, such that planar surfaces of the second layer are disposed between and face opposing planar surfaces of (i) the first die, and (ii) the integrated passive device, and wherein the planar surfaces are parallel to a surface of a printed circuit board on which the stack is disposed.

2. The circuit of claim 1, further comprising:
   a medium access control module configured to (i) receive data, and (ii) generate a signal comprising the data; and
   a physical layer module configured to transmit the signal, wherein the physical layer module comprises the plurality of active devices and the plurality of passive devices.

3. The circuit of claim 1, wherein the integrated passive device does not include an active device.

4. The circuit of claim 1, wherein the plurality of active devices comprises a plurality of transistors.

5. The circuit of claim 1, wherein:
   the first die is a semiconductor die; and
   the first die comprises a plurality of complementary metal-oxide semiconductor transistors.

6. The circuit of claim 1, wherein:
   the first die is a silicon-on-insulator die; and
   the first die comprises a plurality of metal-oxide-semiconductor field-effect transistors.

7. The circuit of claim 1, wherein:
   the second substrate comprises glass; and
   the plurality of vias comprise a through glass vias.

8. The circuit of claim 1, wherein:
the second substrate comprises silicon; and
the plurality of vias comprise through silicon vias.

9. The circuit of claim 1, further comprising:
a leadframe, wherein the first die is connected to the leadframe;
a first plurality of pads disposed on the leadframe;
a second plurality of pads disposed on the integrated passive device and connected to corresponding ones of the plurality of vias; and
a plurality of bond wires connecting the first plurality of pads respectively to the second plurality of pads,
wherein
the second layer is disposed on the first die, and
the integrated passive device is disposed on the second layer.

10. The circuit of claim 9, further comprising the printed circuit board, wherein the leadframe is disposed on the printed circuit board.

11. The circuit of claim 1, wherein:
the integrated passive device includes a first metallization layer and a second metallization layer;
the first metallization layer comprises a plurality of first conductive elements;
the second metallization layer comprises a plurality of second conductive elements;
the inductance is defined by the plurality of first conductive elements and the plurality of second conductive elements; and
at least some of the plurality of pillars are connected to corresponding ones of the plurality of vias.

12. The circuit of claim 1, wherein the layer comprises:
interconnect devices, wherein the interconnect devices connect the plurality of vias to a plurality of solder bumps;
the second layer is disposed on a first side of the integrated passive device;
the plurality of solder bumps are on a second side of the integrated passive device opposite the first side; and
the first die is disposed on a side of the second layer opposite the integrated passive device.

13. The circuit of claim 1, wherein:
the plurality of active devices include a first amplifier;
the first amplifier is configured to output an output signal; and
the inductance is configured to receive the output signal from the first amplifier and transmit the output signal to an antenna.

14. A circuit comprising:
a first die comprising a first substrate and a plurality of active devices, wherein the plurality of active devices include a first amplifier, and wherein the first amplifier is configured to output an output signal;
an integrated passive device comprising a first layer, a second substrate and a plurality of passive devices, wherein the second substrate comprises a plurality of vias, and wherein the plurality of passive devices include an inductance and are implemented at least on the first layer or the second substrate, wherein the inductance is configured to receive the output signal from the first amplifier and transmit the output signal to an antenna, and wherein a resistivity per unit area of the second substrate is greater than a resistivity per unit area of the first substrate; and
a second layer disposed between the first die and the integrated passive device, wherein the second layer comprises a plurality of pillars, wherein each of the plurality of pillars connects a corresponding one of the plurality of active devices to (i) one of the plurality of vias, or (ii) one of the plurality of passive devices,
wherein the first die, the integrated passive device and the second layer are disposed relative to each other to form a stack;
a second amplifier configured to output a second signal; and
a second inductance comprising an end,
wherein
the end of the second inductance is connected to an input of the first amplifier and to an output of the second amplifier, and
the first amplifier is configured to generate the output signal based on the second signal.

15. The circuit of claim 1, further comprising:
a leadframe,
wherein the first die is disposed on the leadframe,
wherein the second layer is disposed on the first die, and
wherein the integrated passive device is disposed on the second layer;
a third layer disposed on the integrated passive device; and
a third substrate is disposed on the third layer, wherein the third substrate comprises a second plurality of passive devices.

16. The circuit of claim 1, further comprising:
a third layer comprising a third substrate and a second plurality of passive devices, wherein the third layer does not comprise an active device;
the integrated passive device is disposed on the third layer; and
the second layer is disposed on the integrated passive device.

17. The circuit of claim 1, further comprising:
a third layer disposed on the first die; and
a second die disposed on the third layer, wherein the third layer comprises a second plurality of pillars connecting the first die to the second die.

18. A method comprising:
forming a die to include a first substrate and a plurality of active devices;
forming an integrated passive device comprising a first layer, a second substrate and a plurality of passive devices, wherein the second substrate comprises a plurality of vias, wherein the plurality of passive devices comprise an inductance, wherein the inductance is defined by (i) a plurality of layers of the integrated passive device including the first layer and the second substrate, and (ii) the plurality of vias, wherein the plurality of passive devices are implemented on at least the first layer or the second substrate, and wherein a resistivity per unit area of the second substrate is greater than a resistivity per unit area of the first substrate; and
disposing a second layer between the die and the integrated passive device, wherein the second layer comprises a plurality of pillars, wherein the disposing of the second layer between the die and the integrated passive device includes
connecting each of the plurality of pillars to (i) a corresponding one of the plurality of active devices and to (ii) one of the plurality of vias or one of the plurality of passive devices, and
connecting at least some of the plurality of pillars to corresponding ones of the plurality of vias, wherein the die, the integrated passive device and the second layer are disposed in a parallel arrangement relative to each other to form a stack, such that planar surfaces of the second layer are disposed between and face opposing planar surfaces of (i) the first die, and (ii) the integrated passive device, and wherein the planar surfaces are parallel to a surface of a printed circuit board on which the stack is disposed.

19. The method of claim 18, further comprising:

connecting the die to a leadframe;

forming a first plurality of pads on the leadframe;

forming a second plurality of pads on the second layer; and connecting the first plurality of pads to the second plurality of pads by a plurality of bond wires, wherein the second layer is formed on the die, and the integrated passive device is formed on the second layer.

20. The method of claim 18, wherein:

the second layer is formed on the integrated passive device; and the die is stacked on the second layer.

\* \* \* \* \*